(12) United States Patent
Lee (10) Patent No.: US 11,619,876 B1
(45) Date of Patent: Apr. 4, 2023

(54) SYSTEM OF INSPECTING PATTERN DEFECT IN SCANNING-TYPE REFLECTIVE EXTREME ULTRAVIOLET MASK

(71) Applicant: SAMSUNG ELECTRONICS CO., LTD., Suwon-si (KR)

(72) Inventor: Donggun Lee, Hwaseong-si (KR)

(73) Assignees: SAMSUNG ELECTRONICS CO., LTD., Suwon-si (KR); E-SOL, Inc., Hwaseong-si (KR)

( * ) Notice: Subject to any disclaimer, the term of this patent is extended or adjusted under 35 U.S.C. 154(b) by 0 days.

(21) Appl. No.: 17/524,210

(22) Filed: Nov. 11, 2021

(51) Int. Cl.
 *G03F 1/24* (2012.01)
 *G03F 7/20* (2006.01)

(52) U.S. Cl.
 CPC .............. *G03F 1/24* (2013.01); *G03F 7/7065* (2013.01)

(58) Field of Classification Search
 CPC . G03F 1/24; G03F 1/84; G03F 7/7065; G03F 7/7085; G03F 7/70033
 See application file for complete search history.

(56) References Cited

U.S. PATENT DOCUMENTS

| 2011/0033025 | A1 | 2/2011 | Lee et al. |
| 2015/0362438 | A1 | 12/2015 | Mann |
| 2020/0003685 | A1* | 1/2020 | Jeon ................ G01N 21/95623 |

FOREIGN PATENT DOCUMENTS

| KR | 10-2009-0120121 A | 11/2009 |
| KR | 10-2011-0049336 A | 5/2011 |
| KR | 10-1272039 B1 | 6/2013 |
| KR | 10-1535230 B1 | 7/2015 |
| KR | 10-1909790 B1 | 10/2018 |
| KR | 10-2020-0132372 A | 11/2020 |
| KR | 10-2257177 B1 | 5/2021 |
| WO | WO-2021052533 A1 * | 3/2021 ............... G03F 1/84 |

* cited by examiner

*Primary Examiner* — Peter B Kim
(74) *Attorney, Agent, or Firm* — Sughrue Mion, PLLC (57) ABSTRACT

Disclosed is a system of inspecting a pattern defect in a scanning-type reflective extreme ultraviolet (EUV) mask. The system may include a photoelectron generator, a source light generator configured to generate a coherent EUV light from electrons generated by the photoelectron generator, a mask positioning structure configured to move the reflective EUV mask, an optic module placed on the mask positioning structure and configured to reflect and focus the EUV light, a zoneplate lens array configured to focus the EUV light on the reflective EUV mask, and a detection array placed near the zoneplate lens array to measure an energy of light reflected from the mask. The entire pattern region of the reflective EUV mask may be inspected by moving the reflective EUV mask using the mask positioning structure to more efficiently inspect a pattern defect in the EUV mask.

11 Claims, 5 Drawing Sheets

| Component | Transmittance |
|---|---|
| M1 spherical mirror reflectance | 0.65 |
| M2 Toroidal Condenser reflectance | 0.65 |
| Zoneplate lens fill efficiency(for 100 zoneplate lens) | 0.005 |
| Zoneplate lens 1st order diffraction efficiency | 0.24 |
| EUV Mask reflectance | 0.63 |
| X-ray filter transmittance(300nm Zr filter & 90% of calculation value) | 0.315 |
| Detector Collection efficiency(sigma 0.1-0.9) | 0.8 |
| Detector QE(quantum efficiency) | 0.8 |
| System photo throughput | 6.40E-05 |

FIG. 6B

| Pattern | HP160nm-corresponding EUV mask pattern |
|---|---|
| Sensitivity | Detect defects causing 10% pattern CD error |
| CD % error(10% of 64nm Line and Space Pattern) | 2.7 |
| Photo number per shots for less than(2.7/2)% shot noise error | 5487 |

FIG. 6C

| ITEM | Value |
|---|---|
| Zoneplate lens focused spot size(nm) | 80 |
| Pulse to pulse position difference, Grid size(nm) | 10 |
| scan area(mm^2)(100mm X 120mm) | 12000 |
| Number of pulse for scan area with fixed grid size | 1.20E+14 |
| Pulse to pulse Repetition rate(MHz) | 162.5 |
| Scan time with a single zoneplate lens(hours) | 205.13 |
| Number of zoneplate lens in zoneplate lens array | 100 |
| Scan time with zoneplate lens array(hours) | 2.1 |

SYSTEM OF INSPECTING PATTERN DEFECT IN SCANNING-TYPE REFLECTIVE EXTREME ULTRAVIOLET MASK

BACKGROUND OF THE INVENTION

The present disclosure relates to a system of inspecting a pattern defect in a scanning-type reflective extreme ultraviolet (EUV) mask, and in particular, to a technology capable of more efficiently performing a pattern defect inspection on the entire pattern region of an EUV mask.

Recently, an EUV lithography technology using EUV light of 13.5 nm wavelength is being applied to fabrication of a highly-integrated semiconductor device.

An EUV exposing system is advantageous in reducing a line width of a pattern because it uses a shorter wavelength than a conventional ArF (193 nm) exposing system, but there is no EUV pellicle that can be applied to a mass production process. The absence of the EUV pellicle may lead to defects in the exposing process, and the yield in the semiconductor manufacturing process is greatly affected by such defects.

In the exposing process, a pellicle is a thin-film structure preventing particles from being attached to a mask during the exposing process, and by using this film, it is possible to prevent a defect from occurring on the mask during the exposing process.

The pellicle is configured to reflect a part of light and to transmit a part of light. Even when a particle is attached to the pellicle, it is far from a pattern on the mask, and thus, in an exposure system, the particle may be copied as an image, which is out of focus, on a wafer and may not cause any effect on a normal pattern.

An EUV pellicle has the same function as a pellicle, which is used in a conventional ArF mask (e.g., a mask for a DUV exposure), but it is very difficult to realize a thin film structure having high transmittance to the EUV light.

The EUV light is highly absorbed by a material, compared with the ArF light, and thus, the EUV pellicle should be manufactured to have a very thin structure. Furthermore, the EUV pellicle should be manufactured to have a highly resistant property to impact and exposure energy or heat, even when the EUV pellicle has such a thin structure.

An EUV pellicle for mass-production, which satisfies these requirements, is currently under development.

Due to the absence of the applicable EUV pellicle, in order to apply the EUV lithography process to a mass-production process, it is necessary to develop an inspection technology of periodically inspecting an EUV mask and monitoring whether or not there is a defect to be copied on a wafer.

As an example of such an inspection technology, Korea Patent Application 10-20110038609 discloses a mask defect inspection system using a photomask.

A technology of most effectively inspecting a copiable fine defect in an EUV mask is called an actinic patterned mask inspection (APMI) technology. In this technology, a light source of EUV wavelength and an EUV optical system are used to inspect a defect in patterns. However, although such technologies are being developed by several inspection system makers, high technical difficulties and high cost are required to develop an EUV image optical system for the APMI technology and thus, until now, there is no successful APMI technology.

SUMMARY

An embodiment of the inventive concept provides a high-performance defect inspection technology that can be used for an EUV mask.

An embodiment of the inventive concept provides a pattern defect inspection system, which is used to inspect an EUV mask, and to which a high power EUV light generating technology and a structure of a highly-efficient EUV optical system are applied.

An embodiment of the inventive concept provides an inspection system, which is configured to quickly inspect the entire pattern region of the EUV mask using a high-repetition EUV light source and a zoneplate lens array technology for focusing a scanning beam in a scanning microscope structure.

According to an embodiment of the inventive concept, a system of inspecting a pattern defect in a scanning-type reflective extreme ultraviolet (EUV) mask may include a photoelectron generator including an ultraviolet (UV) laser, a source light generator configured to generate a coherent EUV light from electrons generated by the photoelectron generator, a mask positioning structure configured to move the reflective EUV mask in a direction of an x-axis or y-axis, an optic module placed on the mask positioning structure and configured to reflect and focus the EUV light generated by the source light generator, a zoneplate lens array configured to focus the EUV light, which is delivered by the optic module, on a region of the reflective EUV mask, and a detection array, which is placed near the zoneplate lens array to measure an energy of light which is focused by the zoneplate lens array and is reflected by the region of the mask. The entire pattern region of the reflective EUV mask may be inspected by moving the reflective EUV mask in left and right directions using the mask positioning structure.

In an embodiment, the source light generator may generate the coherent EUV light in a free-electron laser manner or a synchrotron manner. A central wavelength of the generated light may be within a range of 13 nm to 14 nm, which has high reflectance to the reflective EUV mask.

In an embodiment, the reflective EUV mask may be placed on the mask positioning structure. An order and speed in motion of the reflective EUV mask in the directions of the x- and y-axes may be adjusted such that the entire test region of the reflective EUV mask may be irradiated by a specific distance with light focused by the zoneplate lens array. Furthermore, the motion of the reflective EUV mask may be adjusted such that light reflected from the reflective EUV mask is detected by the detection array.

In an embodiment, the optic module may include a spherical x-ray mirror configured to selectively reflect a portion of the coherent EUV light having a specific wavelength and a toroidal x-ray mirror configured to focus light, which is reflected by the spherical x-ray mirror, on the zoneplate lens array and thereby to improve optical efficiency. The spherical x-ray mirror may be configured to increase a diverging angle of the EUV light.

In an embodiment, the optic module may further include a multi-layered structure, which includes molybdenum (Mo) and silicon (Si) layers stacked on the spherical x-ray mirror and satisfies a spectral bandwidth condition required for an EUV optical system.

In an embodiment, the zoneplate lens array may include one or more zoneplate lens, which are placed between the mask positioning structure and the toroidal x-ray mirror.

In an embodiment, the zoneplate lens array may include N×M zoneplate lens which are arranged to form N columns in an x-axis and M rows in a y-axis.

In an embodiment, the x-axis may be a horizontal direction, and the y-axis may be a vertical direction perpendicular to the x-axis. The number of the zoneplate lens may be N in a direction of the x-axis and M in a direction of the y-axis, where N<M.

In an embodiment, for N=1, the number M may be determined by a length of a side of the reflective EUV mask such that the EUV light is sufficiently incident into the side of the reflective EUV mask.

In an embodiment, the zoneplate lens array may be disposed to be parallel to the reflective EUV mask. Each of the zoneplate lenses may be manufactured to have an elliptical structure, allowing for the parallel disposition to the reflective EUV mask.

In an embodiment, the spherical x-ray mirror may have a convex shape, and a diameter of the spherical x-ray mirror may be determined in consideration of the diverging angle of the EUV light, a distance to an EUV light source, and a diverging angle required for an EUV optical system.

In addition, the EUV light reflected by the spherical x-ray mirror may be delivered to the toroidal x-ray mirror, and the toroidal x-ray mirror may be configured to focus the EUV light on the zoneplate lens array such that the EUV light is sufficiently provided to all of the zoneplate lens of the zoneplate lens array.

In addition, the toroidal x-ray mirror may have an elliptical shape. A focal length or radius of the toroidal x-ray mirror may be determined to effectively focus the EUV light on the zoneplate lens array. A position and an incident angle of the toroidal x-ray mirror may be determined such that an incident angle of a beam incident into the zoneplate lens array ranges from 4° to 8°.

In addition, the zoneplate lens array may be configured to focus the EUV light on the reflective EUV mask. The reflective EUV mask may be configured to reflect the EUV light focused by the zoneplate lens array, and here, an incident angle of a main optic axis of a beam, which is incident into the reflective EUV mask, may range from 4° to 8°.

In addition, the detection array may be configured to detect the EUV light reflected by the reflective EUV mask. The detection array may include N×M photo sensor modules, which are disposed to correspond to the N×M zoneplate lens in a one-to-one manner and to measure an energy of the EUV light, and a DB module, which is configured to store N×M energy data, which are measured at coordinates (x, y) on the reflective EUV mask using photo sensor modules. Here, an amount of light reflected by the reflective EUV mask may be determined by a position of a focal point within the reflective EUV mask.

In addition, the detection array may be configured to measure a light pulse reflected from the reflective EUV mask and to measure all of light pulse signals with high repetition rate in a time resolving manner.

In addition, the detection array may be configured to reconstruct an image of a mask pattern in a test region, using the N×M energy data stored in the DB module.

In an embodiment, a defect in the mask pattern may be detected by comparing the reconstructed image of the mask pattern with a designed data of the mask pattern.

In addition, a pinhole-shaped order sorting aperture may be further provided between the reflective EUV mask and the zoneplate lens array to remove a noise component of the light, which passes through the zoneplate lens but does not include a first order light.

In addition, the source light generator may be operated in a free-electron laser manner using a linear accelerator and an undulator. In the source light generator, the linear accelerator may be used to accelerate photoelectrons, which are generated by irradiating a sample with the UV laser beam, and the accelerated electrons may be injected into the undulator, which includes periodically-arranged magnets, to generate coherent x-ray light.

In addition, the source light generator may be operated in a synchrotron manner using an undulator and a storage ring. In the source light generator, electrons may be injected into the storage ring to increase a repetition rate, and the electrons may be injected into the undulator to generate coherent x-ray light.

Here, the source light generator may include a driver laser G, which is used to generate photoelectron light, and the driver laser may have a repetition rate of several tens of Hertz (Hz), and the repetition rate of the light pulse may be higher than 1 MHz, according to an orbital period of the electrons in the storage ring.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1:
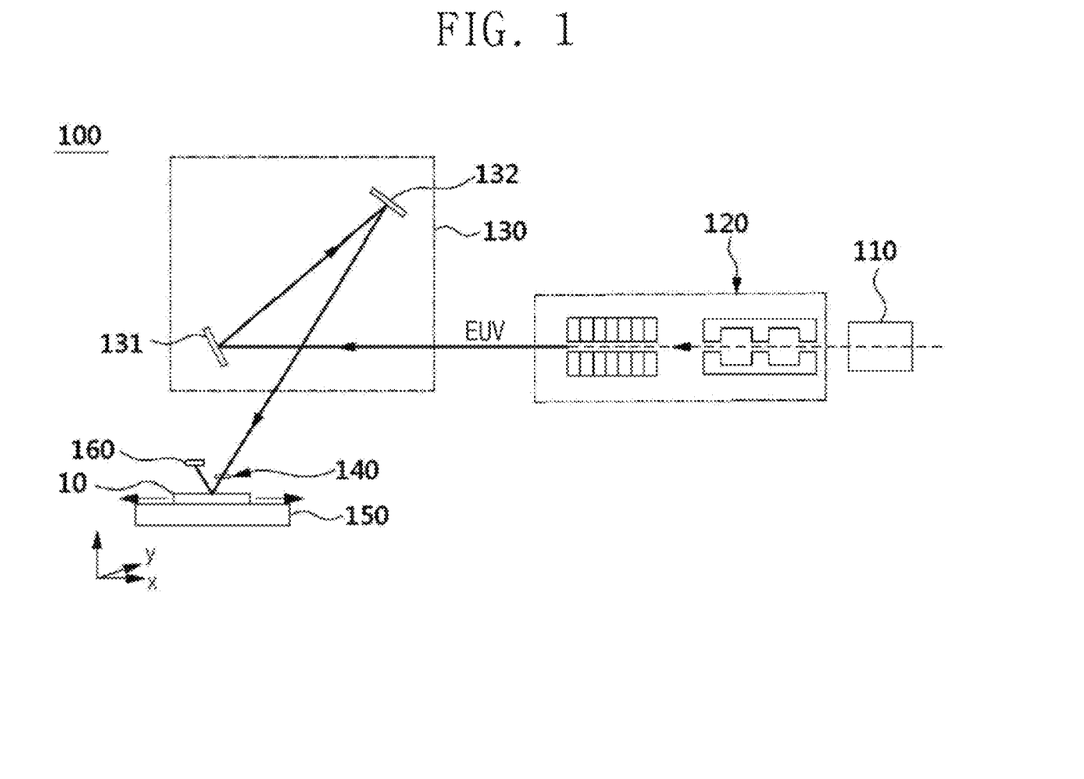
FIG. 1 is a diagram schematically illustrating a system of inspecting a pattern defect in a scanning-type reflective EUV mask.

FIG. 1 is a diagram schematically illustrating a system of inspecting a pattern defect in a scanning-type reflective EUV mask.

Referring to FIG. 1, an inspection system 100 of inspecting one or more reflective EUV mask 10 may include a photoelectron generator 110 including an ultraviolet (UV) laser, a source light generator 120 configured to generate a coherent EUV light from electrons generated by the photoelectron generator 110, a mask positioning structure 150 configured to move the reflective EUV mask 10 in a direction of an x-axis or y-axis, an optic module 130 placed on the mask positioning structure 150 and configured to reflect and focus the EUV light generated by the source light generator 120, a zoneplate lens array 140 configured to focus the EUV light, which is delivered by the optic module 130, on a region of the reflective EUV mask 10, and a detection array 160, which is placed near the zoneplate lens array 140 to measure an energy of light that is focused by the zoneplate lens array 140 and is reflected by the region of the mask. The entire pattern region of the reflective EUV mask 10 may be inspected by moving the reflective EUV mask 10 in left and right directions using the mask positioning structure 150.

In addition, the source light generator 120 may generate the coherent EUV light in a free-electron laser manner or a synchrotron manner. A central wavelength of the generated light may be within a range of 13 nm to 14 nm, which has high reflectance to the reflective EUV mask.

The reflective EUV mask 10 may be placed on the mask positioning structure 150. An order and speed in motion of the reflective EUV mask 10 in the directions of the x- and y-axes may be adjusted such that the entire test region of the reflective EUV mask may be irradiated by a specific distance with light focused by the zoneplate lens array 140. Furthermore, the motion of the reflective EUV mask 10 may be adjusted such that light reflected from the reflective EUV mask is detected by the detection array 160.

The optic module 130 may include a spherical x-ray mirror 131 configured to selectively reflect a portion of the coherent EUV light having a specific wavelength and a toroidal x-ray mirror 132 configured to focus light, which is reflected by the spherical x-ray mirror 131, on the zoneplate lens array 140 and thereby to improve optical efficiency.

In addition, the zoneplate lens array 140 may be placed between the mask positioning structure 150 and the toroidal x-ray mirror 132.

The zoneplate lens array 140 may be disposed to be parallel to the reflective EUV mask. Each of the zoneplate lenses may be manufactured to have an elliptical structure, allowing for the parallel disposition to the reflective EUV mask.

Figure 2:
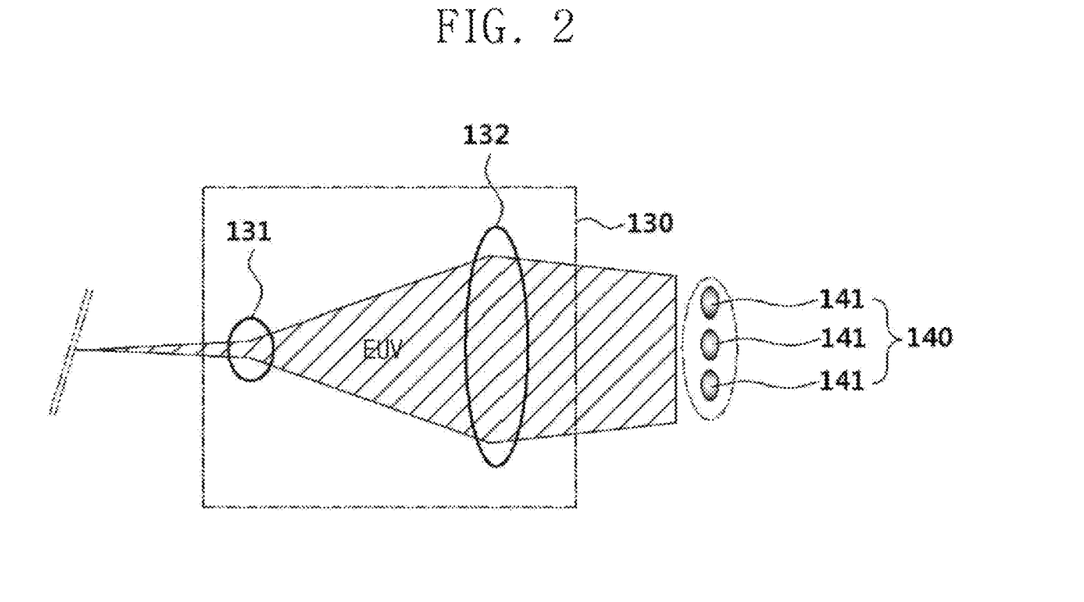
FIG. 2 is a diagram illustrating an optic module of a system of inspecting a pattern defect in a scanning-type reflective EUV mask.

FIG. 2 is a diagram illustrating an optic module of a system of inspecting a pattern defect in a scanning-type reflective EUV mask.

Referring to FIG. 2 the zoneplate lens array 140 may include one or more zoneplate lens 141.

Referring to FIGS. 1 and 2, the spherical x-ray mirror 131 may be configured to increase a diverging angle of the EUV light.

In addition, the optic module 130 may further include a multi-layered structure, which includes molybdenum (Mo) and silicon (Si) layers stacked on the spherical x-ray mirror 131 and satisfies a spectral bandwidth condition required for an EUV optical system.

Figure 3A:
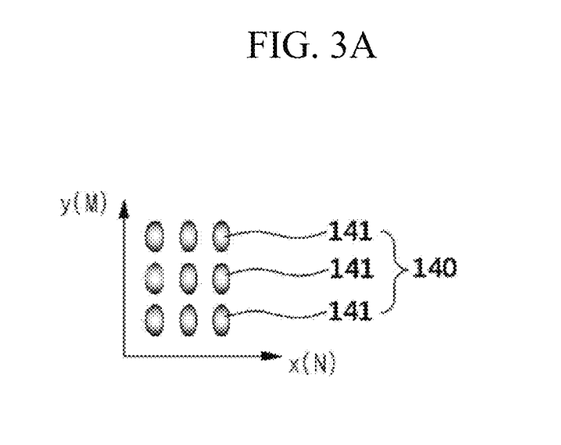
FIGS. 3A and 3B are diagrams illustrating an EUV light, which is incident into a zoneplate lens array of a system of inspecting a pattern defect in a scanning-type reflective EUV mask.
Figure 3B:
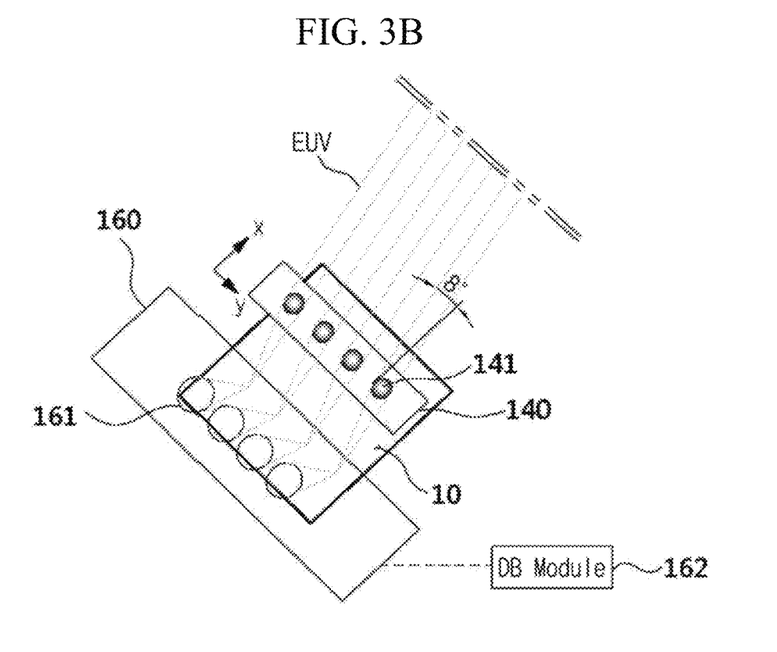

FIGS. 3A and 3B are diagrams illustrating an EUV light, which is incident into a zoneplate lens array of a system of inspecting a pattern defect in a scanning-type reflective EUV mask.

The zoneplate lens array 140 will be described in more detail with reference to FIG. 3A. Referring to FIG. 3A, the zoneplate lens array 140 may include N×M zoneplate lens 141, which are arranged to form N columns and M rows in directions of x- and y-axes, respectively.

In addition, the x-axis may be a horizontal direction, and the y-axis may be a vertical direction perpendicular to the x-axis. The number of the zoneplate lens 141 may be N in the direction of the x-axis and M in the direction of the y-axis, where the number N is less than the number M.

Referring to FIG. 3B, for the number N=1, the number M may be determined by a length of a side of the reflective EUV mask 10 such that the EUV light is sufficiently incident into the side of the reflective EUV mask.

In addition, the toroidal x-ray mirror may have an elliptical shape. A focal length or radius of the toroidal x-ray mirror 132 may be determined to effectively focus the EUV light on the zoneplate lens array 140. A position and an incident angle of the toroidal x-ray mirror 132 may be determined such that an incident angle of a beam incident into the zoneplate lens array 140 ranges from 4° to 8°.

In addition, the zoneplate lens array 140 may be configured to focus the EUV light on the reflective EUV mask. The reflective EUV mask may be configured to reflect the EUV light focused by the zoneplate lens array 140, and here, an incident angle of a main optic axis of a beam, which is incident into the reflective EUV mask, may range from 4° to 8°.

Figure 4A:
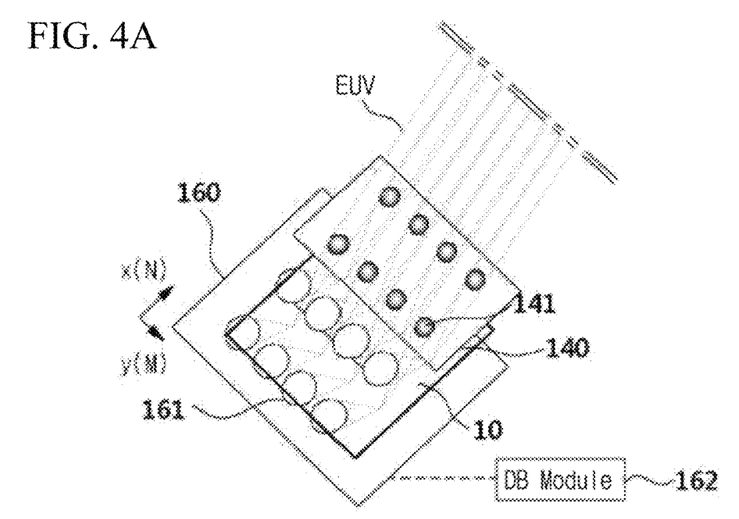
FIGS. 4A and 4B are diagrams illustrating a process of detecting EUV light, which is reflected from by an EUV mask, using a detection array.
Figure 4B:
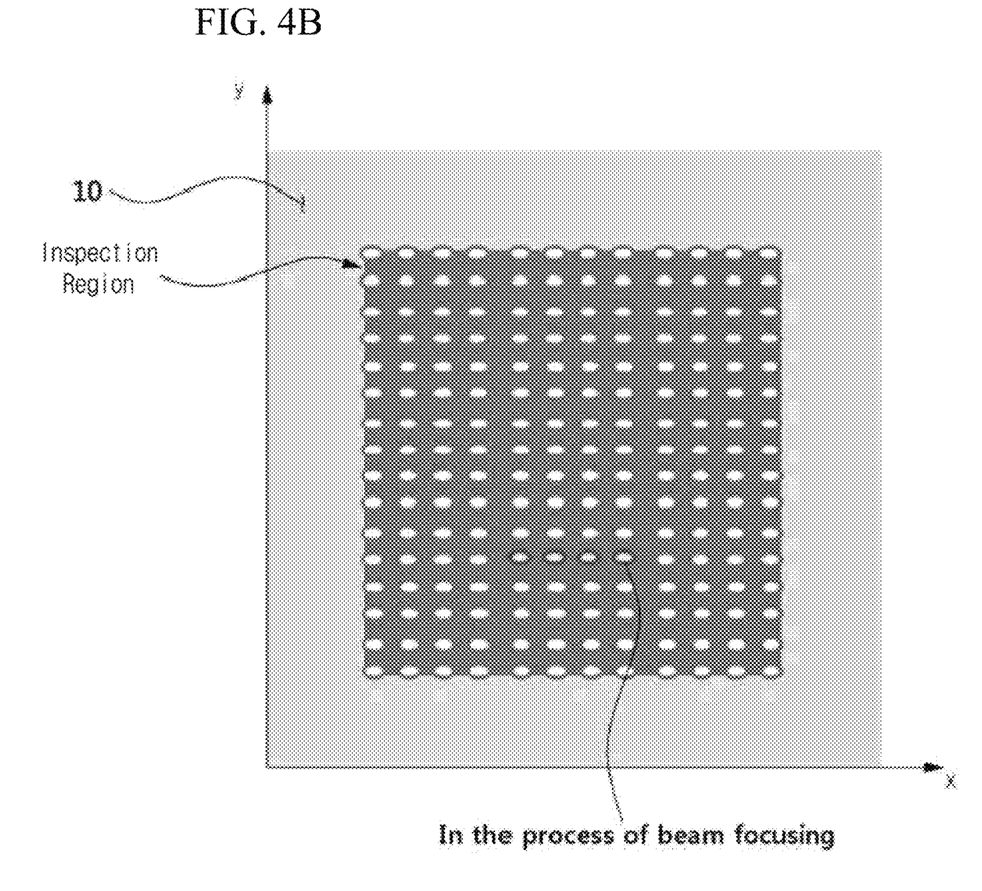

FIGS. 4A and 4B are diagrams illustrating a process of detecting EUV light, which is reflected from by an EUV mask, using a detection array.

Referring to FIG. 4A, the detection array 160 may be configured to detect the EUV light reflected by the reflective EUV mask 10. An amount of light reflected by the reflective EUV mask may be determined by a position of a focal point within the reflective EUV mask 10.

In detail, the detection array 160 may include the N×M photo sensor modules 161, which are disposed to correspond to the N×M zoneplate lens in a one-to-one manner and to measure an energy of the EUV light, and the DB module 162, which is configured to store N×M energy data, which are measured at coordinates (x, y) on the reflective EUV mask using photo sensor modules 161.

In addition, the detection array 160 may be configured to measure a light pulse reflected from the reflective EUV mask 10 and to measure all of light pulse signals with high repetition rate in a time resolving manner.

In an embodiment, the detection array 160 may be used to store data, which are obtained from the measurement, in the DB module and to reconstruct an image of a mask pattern in a test region, using the N×M energy data stored in the DB module 162, as shown in FIG. 4B.

In the detection array 160, a defect in the mask pattern may be detected by comparing the reconstructed image of the mask pattern with a designed data of the mask pattern.

Figure 5:
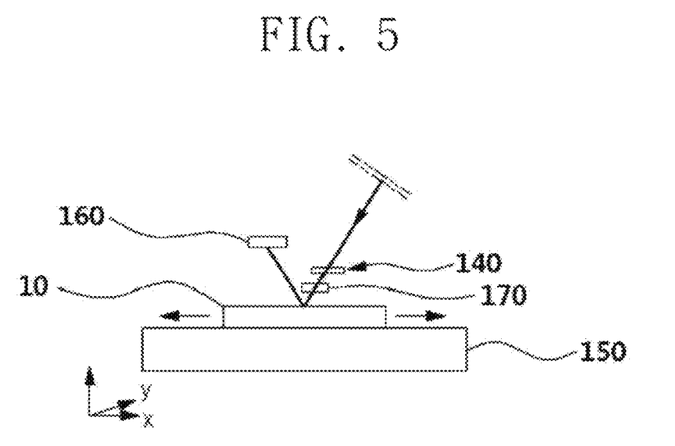
FIG. 5 is a diagram illustrating a pinhole-shaped order sorting aperture, which is further provided in a system of inspecting a pattern defect in a scanning-type reflective EUV mask.

FIG. 5 is a diagram illustrating a pinhole-shaped order sorting aperture, which is further provided in a system of inspecting a pattern defect in a scanning-type reflective EUV mask.

Referring to FIG. 5, a pinhole-shaped order sorting aperture 170 may be further provided between the reflective EUV mask 10 and the zoneplate lens array 140 to remove a noise component of the light, which passes through the zoneplate lens 141 but does not include a first order light.

According to a first embodiment of the inventive concept, the source light generator 120 may be operated in a free-electron laser manner using a linear accelerator and an undulator. In the source light generator 120, the linear accelerator may be used to accelerate photoelectrons, which are generated by irradiating a sample with the UV laser beam, and the accelerated electrons may be injected into the undulator, which includes periodically-arranged magnets, to generate coherent x-ray light.

According to a second embodiment of the inventive concept, the source light generator 120 may be operated in a synchrotron manner using an undulator and a storage ring. In the source light generator 120, electrons may be injected into the storage ring to increase a repetition rate, and the electrons may be injected into the undulator to generate coherent x-ray light.

Here, the source light generator 120 may include a driver laser G, which is used to generate photoelectron light, and the driver laser may have a repetition rate of several tens of Hertz (Hz), and the repetition rate of the light pulse may be higher than 1 MHz, according to an orbital period of the electrons in the storage ring.

Figure 6A:
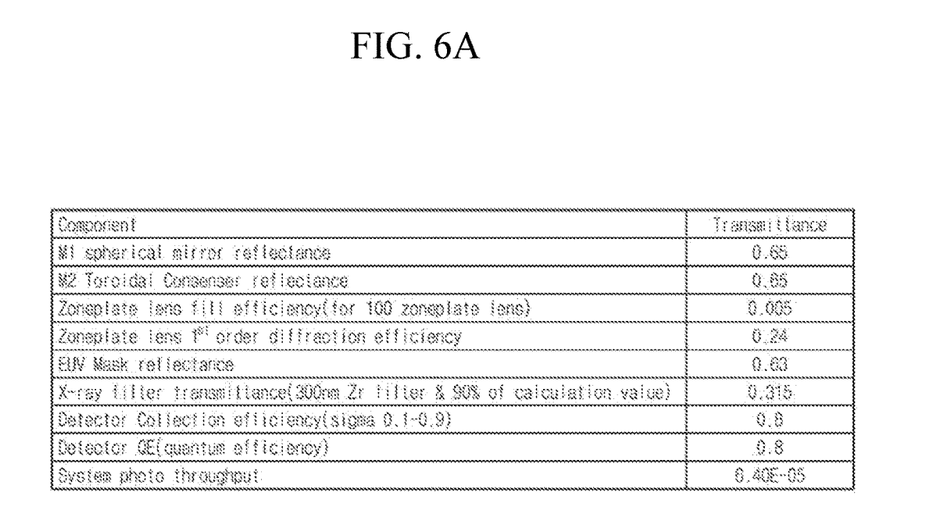
FIGS. 6A, 6B and 6C are tables showing results of a pattern inspection process performed using a system of inspecting a pattern defect in a scanning-type reflective EUV mask.
Figure 6B:
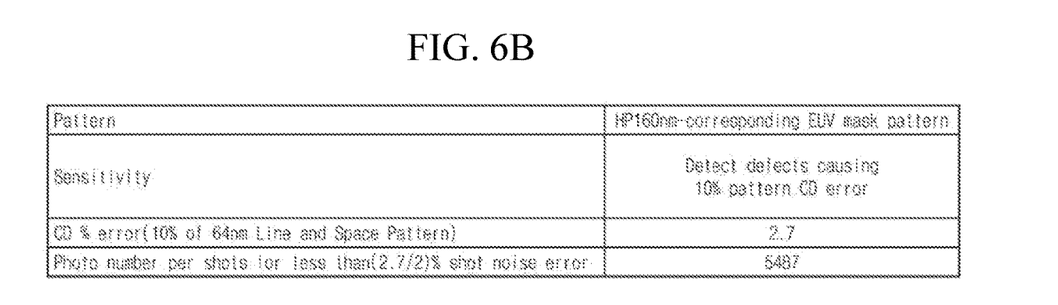
Figure 6C:
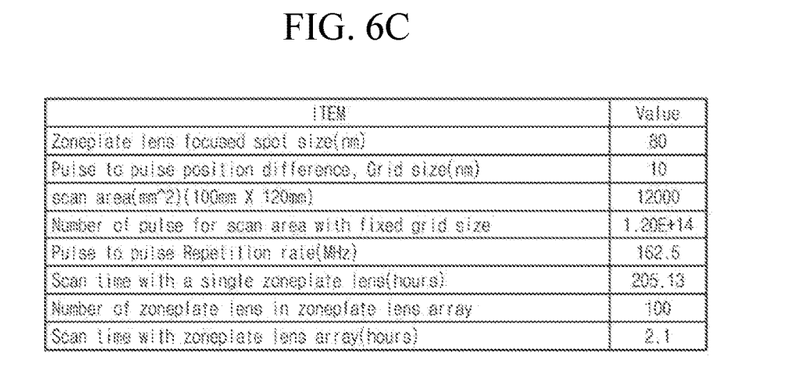

FIG. 6 is tables showing results of a pattern inspection process performed using a system of inspecting a pattern defect in a scanning-type reflective EUV mask.

Referring to FIG. 6(a), an EUV mask defect inspection system according to an embodiment of the inventive concept has a system photon throughput of about $6.4 \times 10^{-5}$. For example, when one million photons are generated and are incident into the system, the number of photons detected by a photon detecting device may be about 6.4.

Referring to FIG. 6(b), a HP16 nm-corresponding EUV mask pattern has a pattern critical dimension (CD) of 64 nm (i.e., 4×16 nm). If a CD error of a pattern formed on a wafer is about 10% and a shot noise of a photon, which is a main inspection error, accounts for 50% of a total measurement error, an inspection sensitivity error caused by the shot noise may be less than or equal to about 1.3%, and the number of photons, which are incident into a detector of the inspection system, should be greater than about 5487. Here, considering the photon throughput, a required EUV source power may be about 0.203 W (watt).

Referring to FIG. 6(c), the EUV light mask defect inspection system according to an embodiment of the inventive concept has a system photon throughput of about $6.4 \times 10^{-5}$, and in order to realize inspection sensitivity appropriable to an EUV mask of HP16 nm node, the EUV source power is about 0.203 W. Under the above EUV energy condition, if a zoneplate lens focused beam size is 80 nm as follows, a stage is moved to have a pulse-to-pulse position difference of 10 nm, a region of the reflective EUV mask 10, on which a pattern defect inspection is performed, has a scan area of 100 mm×120 mm, a pulse to pulse repetition rate of the EUV source is 162.6 MHz, and the number of the zoneplate lens in the zoneplate lens array 140 is 100, it may be possible to complete the pattern inspection process in about 2.1 hours. That is, it may be possible to satisfy an inspection throughput of 2 hours to 6 hours, required by most semiconductor chip manufacturers.

As described above, according to an embodiment of the inventive concept, by using a zoneplate lens array, which is a simple and cost-effective diffraction optical system compared with an EUV mask pattern inspection system using a conventional EUV light source, it may be possible to reduce cost that is required to manufacture or develop the inspection system. In addition, by applying a coherent EUV light, which is generated by a free electron method having a high repetition rate and high power property or a synchrotron method using an undulator, to a scanning-type inspection system, it may be possible to reduce cost for maintenance for a light source and to improve stability of the light source, compared with a conventional plasma-based EUV light source.

Thus, a defect of a pattern in an EUV mask, which may be transferred to a wafer exposing system, may be found during a mask manufacturing process, and it may be possible to periodically inspect an environmental defect, which occurs during an exposure process in an EUV wafer exposing system, or a pattern defect, which occurs from an EUV mask during an exposure process using EUV light. Accordingly, it may be possible to prevent a large amount of failures, which are caused by a defect pattern of a mask, from occurring on a wafer and thereby to improve a wafer yield.

At least one of the components, elements, modules or units (collectively "components" in this paragraph) of the system of inspecting a pattern defect in a scanning-type reflective EUV mask in the above embodiments may be embodied as various numbers of hardware, software and/or firmware structures that execute respective functions described above, according to an example embodiment. These components may include the photoelectron generator 110, the source light generator 120, the mask positioning structure 150, and the detection array 160 shown in FIG. 1. At least one of these components may use a direct circuit structure, such as a memory, a processor, a logic circuit, a look-up table, etc. that may execute the respective functions through controls of one or more microprocessors or other control apparatuses. At least one of these components may include or may be implemented by a processor such as a central processing unit (CPU) that performs the respective functions, a microprocessor, or the like.

While example embodiments of the inventive concept have been particularly shown and described, it will be understood by one of ordinary skill in the art that variations in form and detail may be made therein without departing from the spirit and scope of the attached claims.

What is claimed is:

1. A system of inspecting a pattern defect in a scanning-type reflective extreme ultraviolet (EUV) mask, comprising:
    a photoelectron generator comprising an ultraviolet (UV) laser;
    a source light generator configured to generate a coherent EUV light from electrons generated by the photoelectron generator;
    a mask positioning structure configured to move the reflective EUV mask in a direction of an x-axis or y-axis;
    an optic module placed on the mask positioning structure, and configured to reflect and focus the EUV light generated by the source light generator;
    a zoneplate lens array configured to focus the EUV light, which is delivered by the optic module, on a region of the reflective EUV mask; and
    a detection array, which is placed near the zoneplate lens array to measure an energy of light which is focused by the zoneplate lens array and is reflected by the region of the mask,
    wherein an entire pattern region of the reflective EUV mask is inspected by moving the reflective EUV mask in left and right directions using the mask positioning structure.

2. The system of claim 1, wherein the source light generator is configured to generate the coherent EUV light in a free-electron laser manner or a synchrotron manner,
    wherein a central wavelength of the generated light is within a range of 13 nm to 14 nm, which has high reflectance to the reflective EUV mask.

3. The system of claim 2, wherein the reflective EUV mask is placed on the mask positioning structure,
    wherein an order and speed in motion of the reflective EUV mask in the directions of the x-axis and the y-axis are configured to be adjusted such that an entire test region of the reflective EUV mask is irradiated by a specific distance with light focused by the zoneplate lens array, and
    wherein the motion of the reflective EUV mask is configured to be adjusted such that light reflected from the reflective EUV mask is detected by the detection array.

4. The system of claim 3, wherein the optic module comprises:
    a spherical x-ray mirror configured to selectively reflect a portion of the coherent EUV light having a specific wavelength; and
    a toroidal x-ray mirror configured to focus light, which is reflected by the spherical x-ray mirror, on the zoneplate lens array and thereby to improve optical efficiency,
    wherein the spherical x-ray mirror is configured to increase a diverging angle of the EUV light.

5. The system of claim 4, wherein the optic module further comprises a multi-layered structure, which comprises molybdenum (Mo) and silicon (Si) layers stacked on the spherical x-ray mirror and satisfies a spectral bandwidth condition required for an EUV optical system.

6. The system of claim 5, wherein the zoneplate lens array comprises one or more zoneplate lenses, which are placed between the mask positioning structure and the toroidal x-ray mirror.

7. The system of claim 6, wherein the zoneplate lens array comprises N×M zoneplate lenses which are arranged to form N columns in an x-axis and M rows in a y-axis.

8. The system of claim 7, wherein the x-axis is a horizontal direction, and the y-axis is a vertical direction perpendicular to the x-axis, and
    wherein a number of the zoneplate lenses is N in a direction of the x-axis and M in a direction of the y-axis, where N<M.

9. The system of claim 8, wherein for N=1, the number M is determined by a length of a side of the reflective EUV mask such that the EUV light is sufficiently incident into the side of the reflective EUV mask.

10. The system of claim 9, wherein the zoneplate lens array is disposed to be parallel to the reflective EUV mask, and
    wherein each of the zoneplate lenses is manufactured to have an elliptical structure, allowing for the parallel disposition to the reflective EUV mask.

11. The system of claim 10, wherein the spherical x-ray mirror has a convex shape, and
    wherein a diameter of the spherical x-ray mirror is determined in consideration of the diverging angle of the EUV light, a distance to an EUV light source, and a diverging angle required for an EUV optical system.

* * * * *